United States Patent
Shei et al.

(10) Patent No.: US 7,675,077 B2
(45) Date of Patent: Mar. 9, 2010

(54) LIGHT-EMITTING DIODE AND METHOD FOR MANUFACTURING THE SAME

(75) Inventors: Shih-Chang Shei, Tainan (TW);
Schang-Jing Hon, Tainan (TW);
Shih-Chen Wei, Tainan (TW); Juh-Yuh Su, Yongkang (TW)

(73) Assignee: Epistar Corporation, Hsinchu (TW)

( * ) Notice: Subject to any disclaimer, the term of this patent is extended or adjusted under 35 U.S.C. 154(b) by 156 days.

(21) Appl. No.: 11/627,013

(22) Filed: Jan. 25, 2007

(65) Prior Publication Data

US 2008/0157107 A1 Jul. 3, 2008

(30) Foreign Application Priority Data

Dec. 29, 2006 (TW) ............... 95150027 A

(51) Int. Cl.
*H01L 33/00* (2006.01)
(52) U.S. Cl. ................. 257/97; 257/E33.032
(58) Field of Classification Search ........................ None
See application file for complete search history.

(56) References Cited

U.S. PATENT DOCUMENTS

| | | | |
|---|---|---|---|
| 5,376,580 A | | 12/1994 | Kish et al. |
| 6,015,719 A | * | 1/2000 | Kish et al. .................. 438/29 |
| 7,057,212 B2 | * | 6/2006 | Kim et al. .................. 257/98 |
| 7,485,897 B2 | * | 2/2009 | Seong et al. .................. 257/81 |
| 2003/0111667 A1 | * | 6/2003 | Schubert .................. 257/98 |
| 2003/0143772 A1 | * | 7/2003 | Chen .................. 438/47 |
| 2003/0164503 A1 | | 9/2003 | Chen |
| 2006/0033113 A1 | * | 2/2006 | Lee et al. .................. 257/80 |
| 2006/0057817 A1 | * | 3/2006 | Sonoda et al. .................. 438/455 |
| 2007/0012937 A1 | * | 1/2007 | Liu et al. .................. 257/99 |
| 2008/0157109 A1 | * | 7/2008 | Hon .................. 257/98 |

OTHER PUBLICATIONS

I. Pollentirer et al., Electronics Letters 21st Jun. 1990, vol. 26, No. 13, pp. 925-927.

* cited by examiner

*Primary Examiner*—Sue Purvis
*Assistant Examiner*—Benjamin P Sandvik
(74) *Attorney, Agent, or Firm*—Winston Hsu

(57) ABSTRACT

A light-emitting diode (LED) and a method for manufacturing the same are described. The light-emitting diode comprises: a conductive substrate including a first surface and a second surface opposite to the first surface; a metal bonding layer deposed on the first surface of the conductive substrate; a reflective metal layer deposed on the metal bonding layer; an N-type semiconductor layer deposed on the reflective metal layer; an active layer deposed on the N-type semiconductor layer; a P-type semiconductor layer deposed on the active layer; a window layer deposed on the P-type semiconductor layer, wherein a thickness of the window layer is substantially at least 50 μm, and the window layer is composed of a transparent conductive material; and a P-type electrode deposed on the window layer.

26 Claims, 3 Drawing Sheets

LIGHT-EMITTING DIODE AND METHOD FOR MANUFACTURING THE SAME

RELATED APPLICATIONS

The present application is based on, and claims priority from, Taiwan Application Serial Number 95150027, filed Dec. 29, 2006, the disclosure of which is hereby incorporated by reference herein in its entirety.

FIELD OF THE INVENTION

The present invention relates to a light-emitting diode (LED) and a method for manufacturing the same, and more particularly, to a high efficiency light-emitting diode and a method for manufacturing the same.

BACKGROUND OF THE INVENTION

In the fabrication of light-emitting diodes, III-V group compound semiconductors, such as GaN, AlGaN, InGaN and AlInGaN, are common. Usually, epitaxial structures of most of the light-emitting devices made of the III-V group compound semiconductors are grown on an electrically insulating sapphire substrate, which is different from other light-emitting devices utilizing conductive substrates. The sapphire substrate is an insulator, so an electrode cannot be directly formed on the sapphire substrate. Electrodes have to be formed to be in contact respectively with a P-type semiconductor layer and an N-type semiconductor layer directly, so that the light-emitting devices of the aforementioned type can be completed.

Typically, a material of a growth substrate of a conventional light-emitting diode adopts N-type gallium arsenide (GaAs). The growth substrate composed of N-type GaAs can absorb light, so that most of the photons produced by the active layer of the light-emitting diode while being emitted towards the growth substrate are absorbed by the growth substrate, thus seriously affecting the light emitting efficiency of the light-emitting diode device.

In order to avoid the issue of light being absorbed by the substrate, I. Pollentirer et al. in the Gent university in Belgium disclosed a technology in the journal "Electronics Letters" about directly bonding the GaAs light-emitting diode wafer to the silicon (Si) substrate after the GaAs light-emitting diode wafer is stripped off the GaAs substrate in 1990. Additionally, the U.S. Pat. No. 5,376,580 (application date: Mar. 19, 1993) filed by Hewlett-Packard Co., U.S.A. disclosed a technology about directly bonding the AlGaAs light-emitting diode wafer to the other substrate after the AlGaAs light-emitting diode wafer is stripped off the GaAs substrate. However, the U.S. Pat. No. 5,376,580 has disadvantages of difficult process and low yield caused by the need to consider the consistency of the lattice direction between the bonding wafers, since the bonding mediums are semiconductors.

SUMMARY OF THE INVENTION

One aspect of the present invention is to provide a light-emitting diode, which comprises a thicker window layer, so that the light-emitting diode has a better current-spreading effect, thereby increasing light extraction efficiency and enhancing brightness of the light-emitting diode.

Another aspect of the present invention is to provide a light-emitting diode, which is a P-side up structure, so that it is much easier to perform the roughening treatment of a surface of the light-emitting diode, thereby increasing light extraction efficiency and enhancing brightness.

Still another aspect of the present invention is to provide a method for manufacturing a light-emitting diode, in which a thicker window layer is grown on a growth substrate, so that the window layer can be a temporary supporting structure. Therefore, the removal of the growth substrate, the sequential processes of the illuminant epitaxial structure and some necessary processes of the permanent substrate can be completed before the wafer bonding process. Thus, the process window is greatly increased, and process yield can be effectively enhanced.

Further another aspect of the present invention is to provide a method for manufacturing a light-emitting diode, which can use an alloy having low fusion point as a medium for wafer bonding, so that the reliability of the wafer bonding process can be effectively enhanced.

According to the aforementioned aspects, the present invention provides a light-emitting diode, comprising: a conductive substrate including a first surface and a second surface opposite to the first surface; a metal bonding layer deposed on the first surface of the conductive substrate; a reflective metal layer deposed on the metal bonding layer; an N-type semiconductor layer deposed on the reflective metal layer; an active layer deposed on the N-type semiconductor layer; a P-type semiconductor layer deposed on the active layer; a window layer deposed on the P-type semiconductor layer, wherein a thickness of the window layer is substantially at least 50 μm, and the window layer is composed of a transparent conductive material; and a P-type electrode deposed on the window layer.

According to a preferred embodiment of the present invention, the thickness of the window layer is substantially at least between 50 μm and 200 μm.

According to the aforementioned aspects, the present invention further provides a method for manufacturing a light-emitting diode, comprising: providing a growth substrate; forming an N-type semiconductor layer on the growth substrate; forming an active layer on the N-type semiconductor layer; forming a P-type semiconductor layer on the active layer; forming a window layer on the P-type semiconductor layer, wherein a thickness of the window layer is substantially at least 50 μm, and the window layer is composed of a transparent conductive material; removing the growth substrate; forming a P-type electrode on a portion of the window layer; forming a reflective metal layer on the N-type semiconductor layer, wherein the reflective metal layer and the active layer are on two opposite sides of the N-type semiconductor layer; providing a conductive substrate including a first surface and a second surface opposite to the first surface, wherein a metal bonding layer is formed on the first surface of the conductive substrate; and performing a bonding step to bond the reflective metal layer to the metal bonding layer.

According to a preferred embodiment of the present invention, the step of forming the window layer comprises forming a portion of the thickness of the window layer a metal organic chemical vapor deposition method, and forming the other thickness of the window layer by a vapor phase epitaxy method.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

The present invention discloses a light-emitting diode and a method for manufacturing the same. The light-emitting diode has a thicker window layer, so that the current-spreading effect can be increased, light extraction efficiency can be enhanced, the roughening treatment of the light-emitting diode device is easier, thereby further enhancing light extraction efficiency and increasing brightness of the light-emitting diode device. Besides, the necessary processes can be completed before the wafer bonding step, so the bonding temperature is more flexible, and the process window is wider. Moreover, an alloy with a low fusion point may be used as a medium for wafer bonding, so that the reliability of the wafer bonding process can be improved. In order to make the illustration of the present invention more explicit, the following description is stated with reference to FIGS. 1 through 4.

Figure 1:
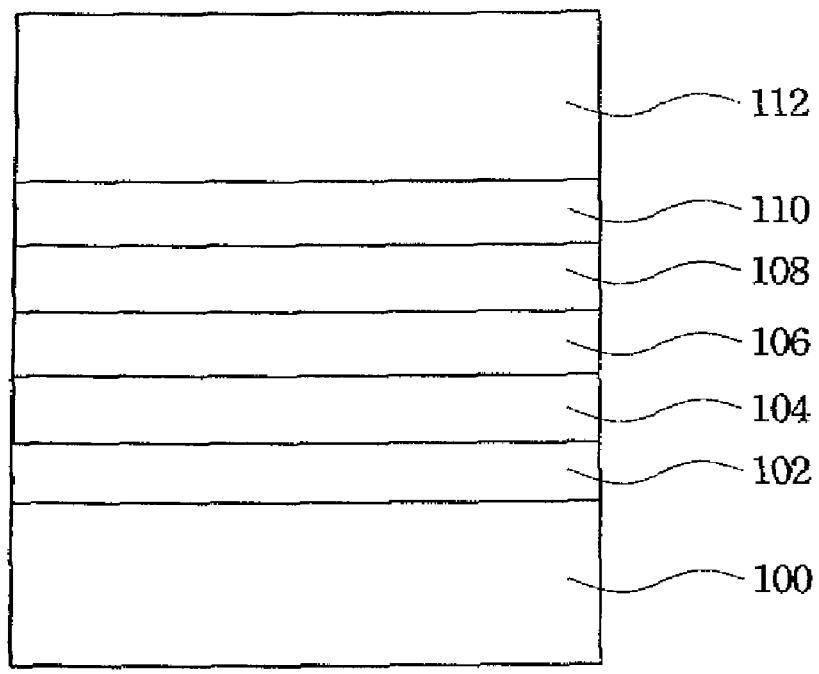
FIGS. 1 through 4 are schematic flow diagrams showing the process for manufacturing a light-emitting diode in accordance with a preferred embodiment of the present invention.

FIGS. 1 through 4 are schematic flow diagrams showing the process for manufacturing a light-emitting diode in accordance with a preferred embodiment of the present invention. In an exemplary embodiment of the present invention, in the fabrication of a light-emitting diode device, a growth substrate 100 is provided, and an N-type semiconductor layer 106 may be directly grown on a surface of the growth substrate 100 by, for example an epitaxy method. In an embodiment of the present invention, an N-type contact layer 104 is selectively formed on the surface of the growth substrate 100, and then the N-type semiconductor layer 106 is epitaxially grown on the N-type contact layer 104 for enhancing the electrical quality of the device. In another embodiment of the present invention, an etching stop layer 102 may be further selectively deposited on the surface of the growth substrate 100, and then the N-type contact layer 104 and the N-type semiconductor layer 106 are epitaxially grown on the etching stop layer 102 in sequence, for successfully removing the growth substrate 100, such as shown in FIG. 1. In the present exemplary embodiment, the etching stop layer 102 and the N-type contact layer 104 are sequentially formed on the growth substrate 100, and then the N-type semiconductor layer 106 is formed on the N-type contact layer 104. A material of the N-type contact layer 104 may by N-type GaAs, N-type GaAsP or N-type AlGaInP. A material of the N-type semiconductor layer 106 may by N-type $(Al_xGa_{1-x})_{0.5}In_{0.5}P$. Next, an active layer 108 is grown on the N-type semiconductor layer 106 by, for example, an epitaxy method, wherein the active layer 108 may be a multiple quantum well (MQW) structure. A P-type semiconductor layer 110 is grown on the active layer 108 by, for example, an epitaxy method, wherein a material of the P-type semiconductor layer 110 may by P-type $(Al_xGa_{1-x})_{0.5}In_{0.5}P$. Then, a window layer 112 is formed on the P-type semiconductor layer 110, such as shown in FIG. 1. The window layer 112 is composed of a transparent conductive material, and a material of the window layer 112 is GaP, GaAsP or AlGaAs. In an exemplary embodiment of the present invention, the window layer 112 is preferably formed by a two-step epitaxial deposition method. In a preferred embodiment of the present invention, a first film having a portion of the thickness the window layer 112 is formed by a metal organic chemical vapor deposition (MOCVD) method, and then a second film having the other portion of the thickness the window layer 112 is formed on the first film by a vapor phase epitaxy (VPE) method. In the exemplary embodiment of the present invention, the window layer 112 has a larger thickness, which is substantially at least 50 μm preferably, such as substantially between 50 μm and 200 μm, to provide the epitaxial structure with sufficient structural supporting during sequential processes.

In the exemplary embodiment of the present invention, the window layer 112 is thicker, and the light-emitting diode device can be fabricated to be a P-side up structure, so that it is conducive to spread current and to increase light extraction efficiency. Besides, the thicker window layer 112 is located above, so that it is conducive to perform a roughening treatment on a surface of the light-emitting device to further increase the light extraction efficiency, and thus enhance the brightness of the light-emitting diode device.

Figure 2:
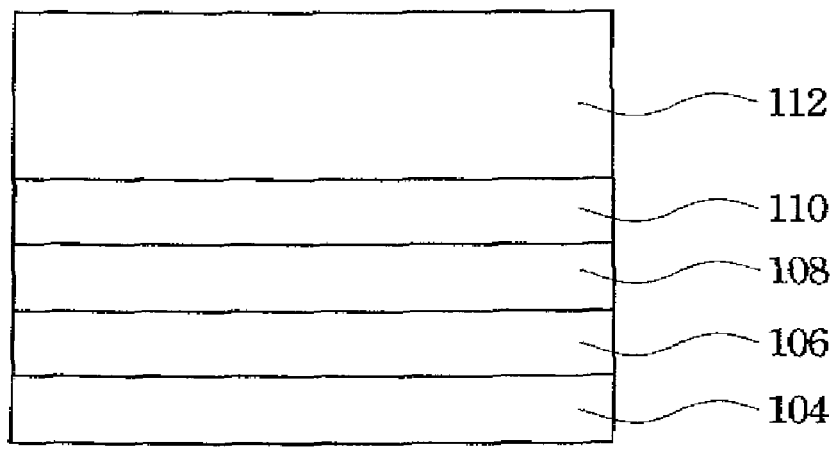

After the formation of the window layer 112, the growth substrate 100 is removed with the window layer 112 as the structural support by, for example, an etching method. At present, the etching stop layer 102 is deposed on the surface of the growth substrate 100, so that the etching stop layer 102 can be used as a terminal point of the etching of the growth substrate 100. In the exemplary embodiment of the present invention, after the growth substrate 100 is removed, the etching stop layer 102 is preferably removed. In the exemplary embodiment, after the removal of the growth substrate 100 is completed, because the N-type contact layer 104 is originally formed on the etching stop layer 102, the N-type contact layer 104 is exposed after removing the growth substrate 100, such as shown in FIG. 2. If the N-type contact layer 104 is not formed, the N-type semiconductor layer 106 is exposed after removing the growth substrate 100.

Because the thicker window layer 112 provides sufficient structural strength for supporting the epitaxial structure during sequential processes, the growth substrate 100 can be successfully removed with the supporting the window layer 112.

Figure 3:
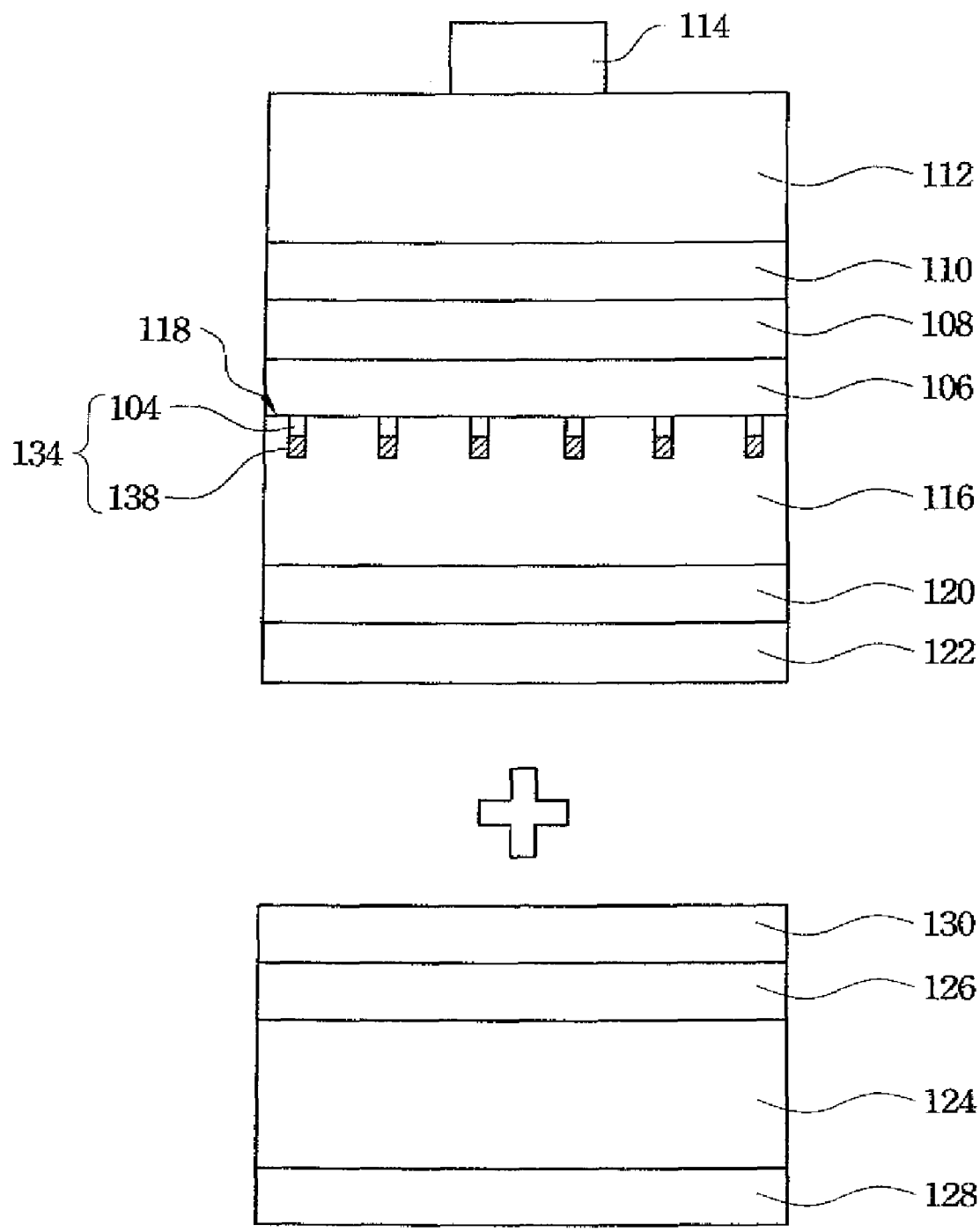

After the growth substrate 100 is removed, the sequential processes can be performed. For example, the N-type contact layer 104 may be selectively patterned to expose a portion of the N-type semiconductor layer 106, and a metal material layer 138 is formed to stack on the N-type contact layer 104 to form the stacked structure of an N-type metal contact layer 134, so as to decrease light-absorbing effects induced by the N-type metal contact layer 134 and to form a meshed or dot electrode structure to obtain better ohmic contact quality and better light extraction efficiency. A material of the metal material layer 138 may be AuGe. Then, a transparent conductive layer 116 is formed to cover the exposed N-type semiconductor layer 106, and the N-type metal contact layer 134 composed of the meshed or dot electrode structure. In the exemplary embodiment of the present invention, a surface 118 of the transparent conductive layer 116 may be connected to the N-type semiconductor layer 106. A material of the transparent conductive layer 116 may be $In_2O_3$, $SnO_2$, ZnO, ITO, CTO, $CuAlO_2$, $CuGaO_2$ or $SrCu_2O_2$. Next, a reflective metal layer 120 may be formed to cover a surface of the transparent conductive layer 116, wherein the reflective metal layer 120 is located on the other surface of the transparent conductive layer 116 opposite to the surface 118, such as shown in FIG. 3. In other embodiments of the present invention, the formation of the transparent conductive layer 116 and the N-type metal contact layer 134 may be omitted, and the reflective metal layer 120 may be directly formed to cover the exposed N-type semiconductor layer 106. A material of the reflective metal layer may be Au, Al, Ag, Cr or Ni. Furthermore, a diffusion barrier layer 122 may be selectively formed to cover the reflective metal layer 120, such as shown in FIG. 3. A material of the diffusion barrier layer 122 may be Mo, Pt, W, ITO, ZnO or Mn. A P-type electrode 114 is formed on a portion of the window layer 112 by, for example, an evaporation deposition method.

At the same time, a permanent substrate, such as a conductive substrate 124, is provided. The conductive substrate 124 is preferably composed of a high electric conductivity and high heat conduction material, wherein a material of the conductive substrate 124 may be Si, Ge, SiC or AlN. In one preferred embodiment of the present invention, a metal bonding layer 130 may be directly formed on a surface of the conductive substrate 124. The metal bonding layer 130 is preferably composed of a metal or an alloy having low fusion point, wherein a material of the metal bonding layer 130 may be PbSn, AuGe, AuBe, AuSn, Sn, In or PdIn. In one preferred embodiment of the present invention, an ohmic contact layer 126 and an ohmic contact layer 128 may be selectively formed on two opposite surfaces of the conductive substrate 124 to make the ohmic contact layer 126 between the metal bonding layer 130 and the conductive substrate 124 to further enhance the electrical quality of the light-emitting diode device, such as shown in FIG. 3. A material of the ohmic contact layer 162 and a material of the ohmic contact layer 128 may be Ti, Ni, Au or W.

In the exemplary embodiment of the present invention, the window layer 112 has a larger thickness, so that after the growth substrate 100 is removed, the necessary processes of the epitaxial wafer can be completed before the wafer bonding step, and the bonding process of the exemplary embodiment is not limited to a lower bonding temperature, thereby broadening the process window and enhancing process yield.

Figure 4:
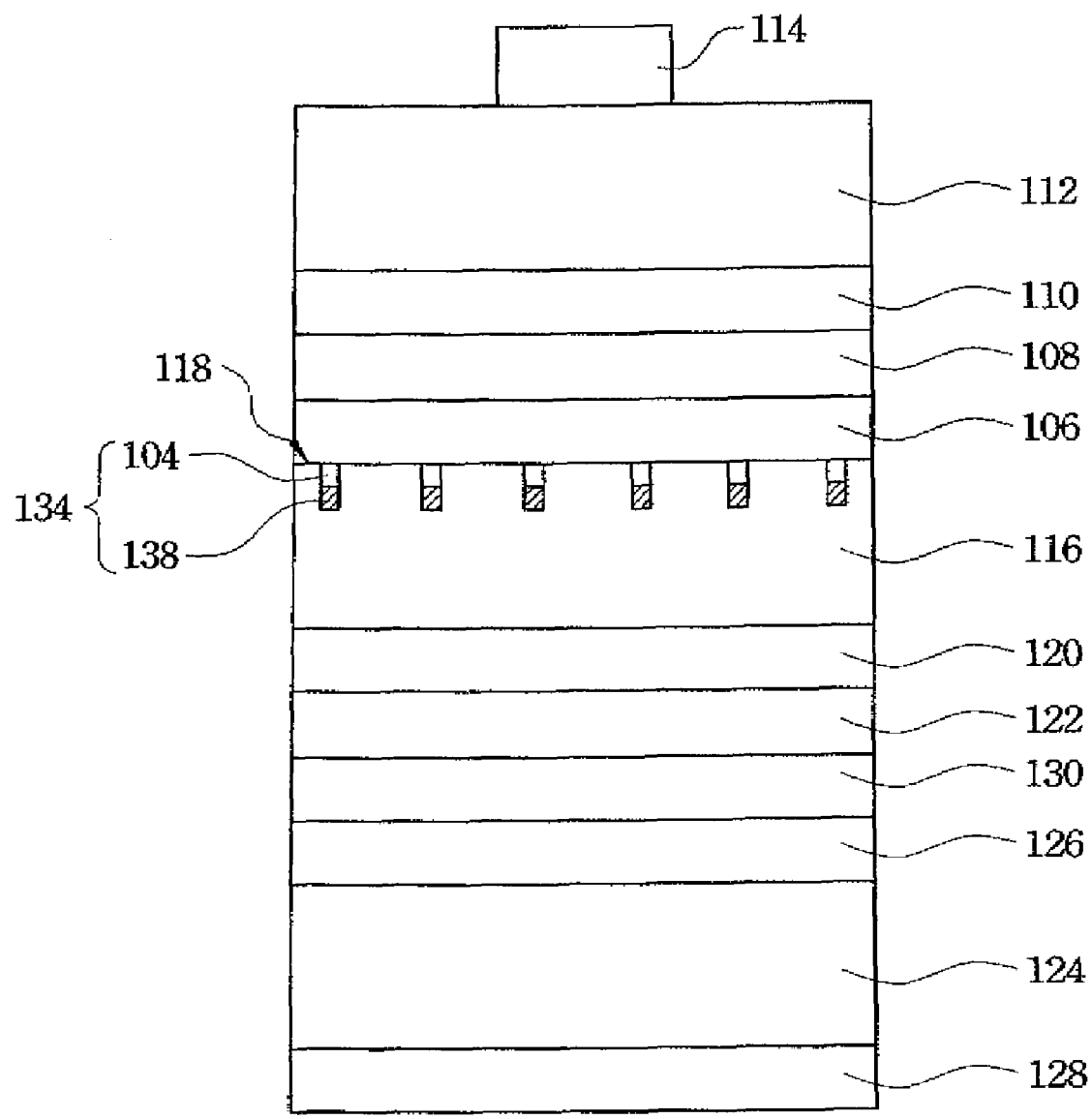

As shown in FIG. 3 and FIG. 4, after the sequential treatment processes of the epitaxial structure wafer supported by the window layer 112 and the conductive substrate 124, a bonding step can be performed by using the metal bonding layer 130, or the diffusion barrier layer 122 and the metal bonding layer 130 on the conductive substrate 124 as bonding mediums to bond the reflective metal layer 120 and the conductive substrate 124, so as to complete the fabrication of a light-emitting diode 132. After bonding, the reflective metal layer 120 may be directly connected with the metal bonding layer 130, or the reflective metal layer 120 may be indirectly connected to the metal bonding layer 130 through the diffusion barrier 122, such as shown in FIG. 4.

In the exemplary embodiment of the present invention, the metal or alloy with a lower fusion point is used as the bonding medium, so that the bonding temperature of the exemplary embodiment is much lower than that of the conventional bonding process using semiconductors as medium, thereby improving the reliability of the wafer bonding and enhancing process yield.

According to the aforementioned description, the light-emitting diode of an exemplary embodiment of the present invention comprises a thicker window layer, so that the light-emitting diode has a better current-spreading effect, thereby increasing light extraction efficiency and enhancing brightness of the light-emitting diode.

According to the aforementioned description, the light-emitting diode of an exemplary embodiment of the present invention is a P-side up structure, so that it is much easier to perform the roughening treatment of a surface of the light-emitting diode, thereby increasing the light extraction efficiency and enhancing brightness.

According to the aforementioned description, in the method for manufacturing a light-emitting diode of an exemplary embodiment of the present invention, a thicker window layer is grown on a growth substrate, so that the window layer can be a temporary supporting structure. Therefore, the removal of the growth substrate, the sequential processes of the illuminant epitaxial structure and some necessary processes of the permanent substrate can be completed before the wafer bonding process. Thus, the process window is greatly increased, and process yield can be effectively enhanced.

According to the aforementioned description, the method for manufacturing a light-emitting diode of an exemplary embodiment of the present invention can use a metal or an alloy with a low fusion point as a medium for wafer bonding, so that the reliability of the wafer bonding process can be effectively enhanced.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A light-emitting diode, comprising:
    a conductive substrate including a first surface and a second surface opposite to the first surface;
    a metal bonding layer deposited on the first surface of the conductive substrate;
    a reflective metal layer deposited on the metal bonding layer;
    a transparent conductive layer deposited on the reflective metal layer;
    an N-type semiconductor layer deposited on the transparent conductive layer;
    an N-type contact layer deposited between a portion of the N-type semiconductor layer and a portion of the transparent conductive layer and embedded in the transparent conductive layer;
    a metal material layer deposited on the N-type contact layer and embedded in the transparent conductive layer;
    an active layer deposited on the N-type semiconductor layer;
    a P-type semiconductor layer deposited on the active layer;
    a window layer deposited on the P-type semiconductor layer, wherein a thickness of the window layer is substantially at least 50 μm, and the window layer is composed of a transparent conductive material; and
    a P-type electrode deposited on the window layer.

2. The light-emitting diode according to claim 1, wherein a material of the conductive substrate is Si, Ge, SiC or AlN.

3. The light-emitting diode according to claim 1, wherein a material of the metal bonding layer is PbSn, AuGe, AuBe, AuSn, Sn, In or PdIn.

4. The light-emitting diode according to claim 1, wherein a material of the reflective metal layer is Au, Al, Ag, Cr or Ni.

5. The light-emitting diode according to claim 1, wherein a material of the N-type semiconductor layer is N-type $(Al_xGa_{1-x})_{0.5}In_{0.5}P$, and a material of the P-type semiconductor layer is P-type $(Al_xGa_{1-x})_{0.5}In_{0.5}P$.

6. The light-emitting diode according to claim 1, wherein a material of the window layer is GaP, GaAsP or AlGaAs.

7. The light-emitting diode according to claim 1, wherein the thickness of the window layer is substantially between 50 μm and 200 μm.

8. The light-emitting diode according to claim 1, further comprising:
    a first ohmic contact layer deposited on the first surface of the conductive substrate and between the conductive substrate and the metal bonding layer; and
    a second ohmic contact layer deposited on the second surface of the conductive substrate.

9. The light-emitting diode according to claim 8, a material of the first ohmic contact layer and a material of the second ohmic contact layer are Ti, Ni, Au or W.

10. The light-emitting diode according to claim 1, further comprising
a diffusion barrier layer between the metal bonding layer and the reflective metal layer.

11. The light-emitting diode according to claim 10, wherein a material of the diffusion barrier layer is Mo, Pt, W, ITO, ZnO or Mn.

12. The light-emitting diode according to claim 1, wherein a material of the transparent conductive layer is $In_2O_3$, $SnO_2$, ZnO, ITO, CTO, $CuAlO_2$, $CuGaO_2$ or $SrCu_2O_2$.

13. The light-emitting diode according to claim 1, wherein a material of the N-type contact layer is N-type GaAs, N-type GaAsP or N-type AlGaInP.

14. A light-emitting diode, comprising:
a substrate including a first surface and a second surface opposite to the first surface;
a bonding layer deposed on the first surface of the substrate;
a reflective layer deposed on the bonding layer;
a transparent conductive layer deposed on the reflective layer;
a first semiconductor layer deposed on the transparent conductive layer;
a first contact layer deposed between a portion of the first semiconductor layer and a portion of the transparent conductive layer and embedded in the transparent conductive layer, wherein a material of the first contact layer is N-type GaAs, N-type GaAsP or N-type AlGaInP;
a metal material layer deposed on the first contact layer and embedded in the transparent conductive layer;
an active layer deposed on the first semiconductor layer; and
a second semiconductor layer deposed on the active layer.

15. The light-emitting diode according to claim 14, further comprising:
a window layer deposed on the second semiconductor layer, wherein a thickness of the window layer is substantially at least 50 μm, and the window layer is composed of a transparent conductive material.

16. The light-emitting diode according to claim 14, wherein a material of the substrate is Si, Ge, SiC or AlN.

17. The light-emitting diode according to claim 14, wherein a material of the bonding layer is PbSn, AuGe, AuBe, AuSn, Sn, In or PdIn.

18. The light-emitting diode according to claim 14, wherein a material of the reflective layer is Au, Al, Ag, Cr or Ni.

19. The light-emitting diode according to claim 14, wherein a material of the first semiconductor layer is N-type $(Al_xGa_{1-x})_{0.5}In_{0.5}P$, and a material of the second semiconductor layer is P-type $(Al_xGa_{1-x})_{0.5}In_{0.5}P$.

20. The light-emitting diode according to claim 15, wherein a material of the window layer is GaP, GaAsP or AlGaAs.

21. The light-emitting diode according to claim 15, wherein the thickness of the window layer is substantially between 50 μm and 200 μm.

22. The light-emitting diode according to claim 14, further comprising:
a first ohmic contact layer deposed on the first surface of the substrate and between the substrate and the bonding layer; and
a second ohmic contact layer deposed on the second surface of the substrate.

23. The light-emitting diode according to claim 22, a material of the first ohmic contact layer and a material of the second ohmic contact layer are Ti, Ni, Au or W.

24. The light-emitting diode according to claim 14, further comprising
a diffusion barrier layer between the bonding layer and the reflective layer.

25. The light-emitting diode according to claim 24, wherein a material of the diffusion barrier layer is Mo, Pt, W, ITO, ZnO or Mn.

26. The light-emitting diode according to claim 14, wherein a material of the transparent conductive layer is $In_2O_3$, $SnO_2$, ZnO, ITO, CTO, $CuAlO_2$, $CuGaO_2$ or $SrCu_2O_2$.

* * * * *